(12) United States Patent
Liu et al.

(10) Patent No.: US 11,294,286 B2
(45) Date of Patent: Apr. 5, 2022

(54) PATTERN FORMATION METHOD USING A PHOTO MASK FOR MANUFACTURING A SEMICONDUCTOR DEVICE

(71) Applicant: TAIWAN SEMICONDUCTOR MANUFACTURING CO., LTD., Hsinchu (TW)

(72) Inventors: Ru-Gun Liu, Hsinchu County (TW); Chin-Hsiang Lin, Hsinchu (TW); Cheng-I Huang, Hsinchu (TW); Chih-Ming Lai, Hsinchu (TW); Chien-Wen Lai, Hsinchu (TW); Ken-Hsien Hsieh, Taipei (TW); Shih-Ming Chang, Hsinchu (TW); Yuan-Te Hou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 158 days.

(21) Appl. No.: 16/287,450

(22) Filed: Feb. 27, 2019

(65) Prior Publication Data
US 2020/0004137 A1 Jan. 2, 2020

Related U.S. Application Data

(60) Provisional application No. 62/690,802, filed on Jun. 27, 2018.

(51) Int. Cl.
*G03F 7/20* (2006.01)
*G03F 1/42* (2012.01)
*G03F 1/68* (2012.01)
*G03F 1/50* (2012.01)

(52) U.S. Cl.
CPC ............. *G03F 7/20* (2013.01); *G03F 1/42* (2013.01); *G03F 1/50* (2013.01); *G03F 1/68* (2013.01); *G03F 7/2004* (2013.01); *G03F 7/70466* (2013.01)

(58) Field of Classification Search
None
See application file for complete search history.

(56) References Cited

U.S. PATENT DOCUMENTS

| 2007/0128525 | A1* | 6/2007 | Wallace | .................... G03F 1/36 430/5 |
| 2007/0258073 | A1 | 11/2007 | Finders et al. | |
| 2009/0061362 | A1* | 3/2009 | Taoka | ................. G03F 7/70283 430/319 |
| 2020/0098545 | A1* | 3/2020 | Chang | .................. G03F 7/2061 |

FOREIGN PATENT DOCUMENTS

| JP | H06-242594 A | 9/1994 |
| JP | H06-275492 A | 9/1994 |
| JP | 2000-252199 A | 9/2000 |
| TW | 200531147 A | 9/2005 |
| TW | 201415159 A | 4/2014 |

* cited by examiner

*Primary Examiner* — Kathleen Duda
(74) *Attorney, Agent, or Firm* — McDermott Will & Emery LLP

(57) ABSTRACT

A photo mask for manufacturing a semiconductor device includes a first pattern extending in a first direction, a second pattern extending in the first direction and aligned with the first pattern, and a sub-resolution pattern extending in the first direction, disposed between an end of the first pattern and an end of the second pattern. A width of the first pattern and a width of the second pattern are equal to each other, and the first pattern and the second pattern are for separate circuit elements in the semiconductor device.

20 Claims, 10 Drawing Sheets

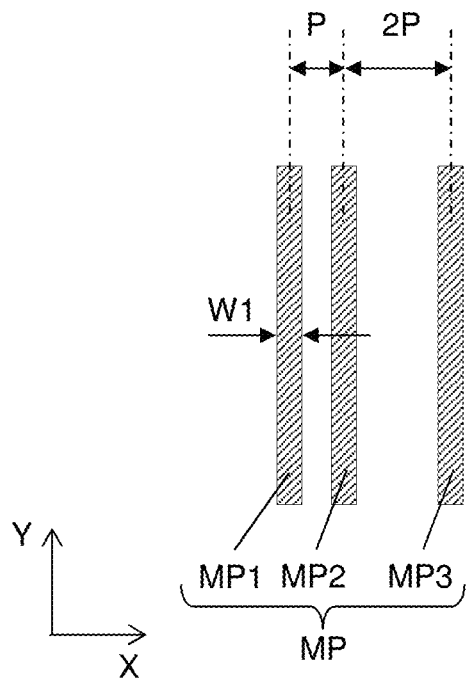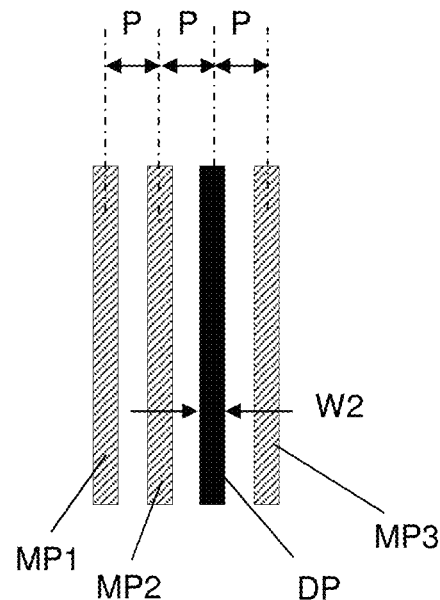
FIG. 1A  FIG. 1B
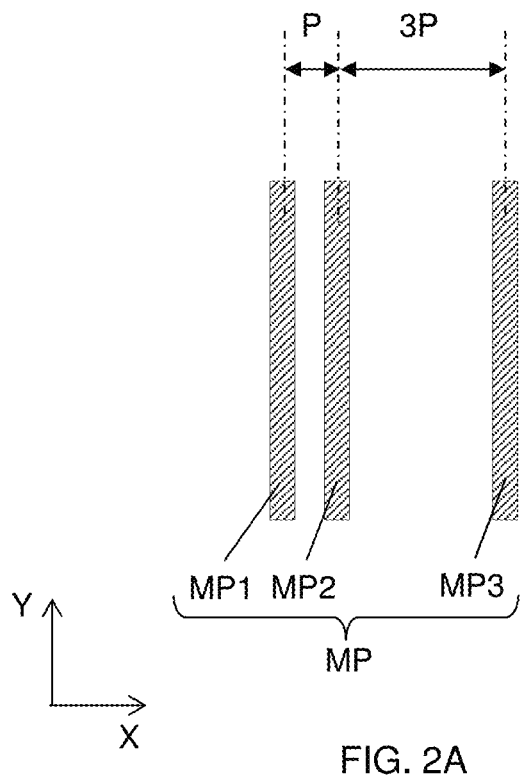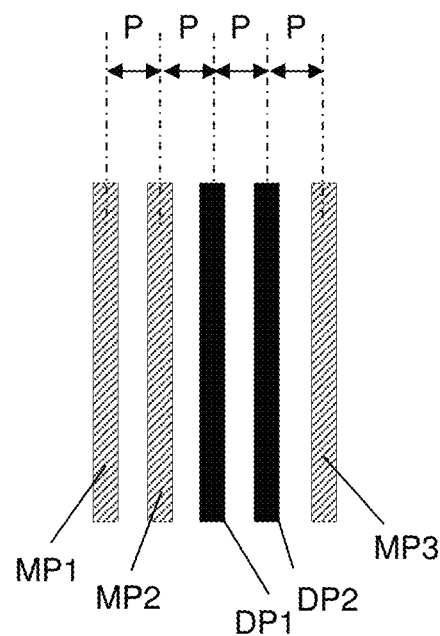
FIG. 2A  FIG. 2B

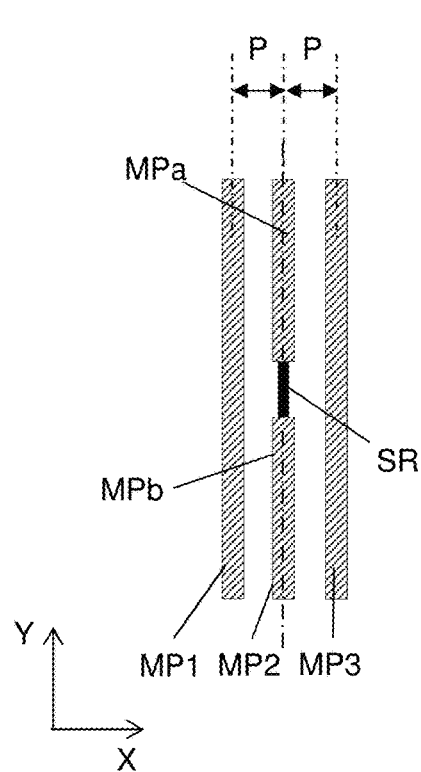 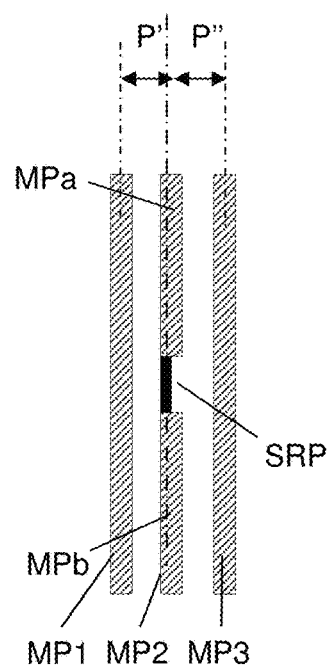 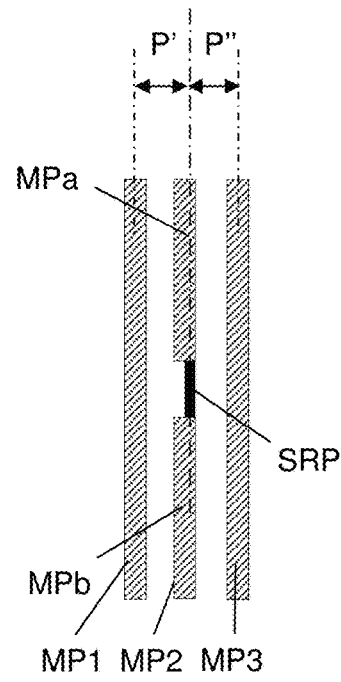
FIG. 5A  FIG. 5B  FIG. 5C
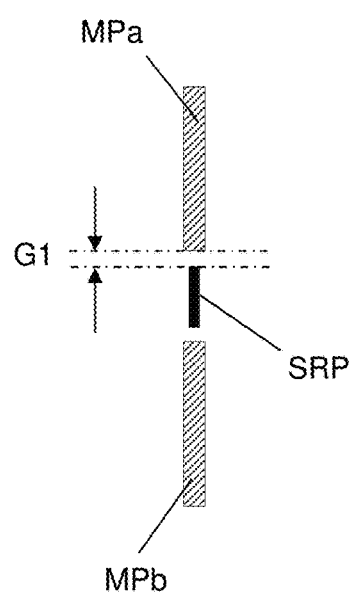
FIG. 5D

PATTERN FORMATION METHOD USING A PHOTO MASK FOR MANUFACTURING A SEMICONDUCTOR DEVICE

RELATED APPLICATION

This application claims priority of U.S. Provisional Patent Application No. 62/690,802 filed on Jun. 27, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues become greater. Lithography operations are one of the key operations in the semiconductor manufacturing process. The light sources used in the lithography operations are in a deep ultra violet (DUV) region, such as a KrF or an ArF excimer laser. Extreme UV sources (EUV) are being developed to resolve smaller features over a semiconductor substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B show pattern layouts on a photo mask according to an embodiment of the present disclosure.

FIGS. 2A and 2B show pattern layouts on a photo mask according to an embodiment of the present disclosure.

FIGS. 5A, 5B, 5C and 5D show pattern layouts on a photo mask according to embodiments of the present disclosure.

DETAILED DESCRIPTION

Figure 3A:
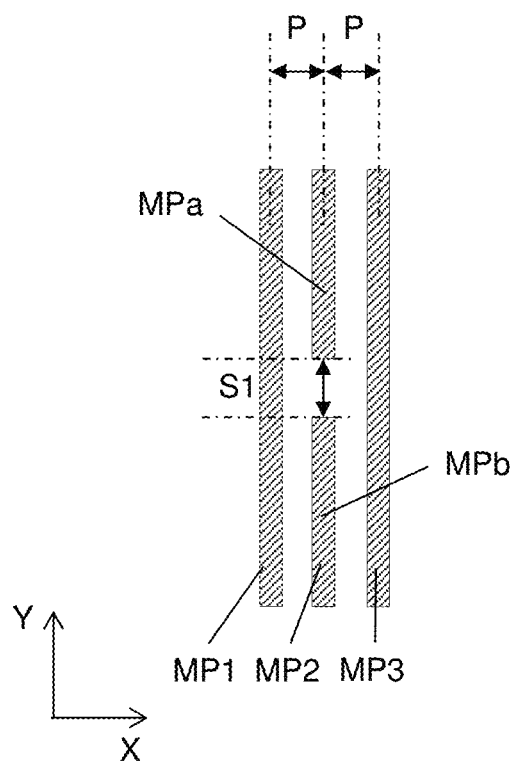
FIGS. 3A and 3B show pattern layouts on a photo mask according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Semiconductor devices according to embodiments of the present disclosure include conductive structures that include a plurality of gate electrode patterns and a plurality of wiring patterns. These patterns are regularly arranged with a constant pitch (i.e., line-and-space pattern) based on the resolution limit of an optical lithography operation and/or other process conditions in some embodiments. The minimum line pitches patternable by a single exposure DUV lithography operation are about 70-80 nm, and the minimum line pitches patternable by a single exposure EUV lithography operation are about 20-40 nm. Further, when the semiconductor technology node decreases to 10 nm or smaller, minimum line pitches, the single exposure lithography operations will face various problems, such as a smaller focus margin, lager lens aberration effect, and lower pattern fidelity. An optical proximity correction technology, for example, has been developed to resolve these problems. However, it requires a large data volume for photo mask production and requires complex mask design.

In the present disclosure, photo mask patterns that improve lithography process margins will be provided. In the present disclosure, all dimensions (e.g., pitch, length, widths, etc.) refer to dimensions on a wafer or on a design layout, and do not mean dimensions on a photo mask, unless otherwise defined. If a photo mask is designed and manufactured to a ×4 reduction lithography tool (e.g., stepper or scanner), a 10 nm pattern on a wafer or on a design layout is a 40 nm pattern on a photo mask, and if a photo mask is designed and manufactured to a ×5 reduction lithography tool, a 10 nm pattern on a wafer or on a design layout is a 50 nm pattern on a photo mask.

FIGS. 1A and 1B show pattern layouts on a photo mask according to embodiments of the present disclosure. In FIG. 1A, which is an original layout, main patterns MP are for a gate electrode pattern in some embodiments, and are for a metal wiring pattern in other embodiments. The main patterns MP are positioned with a pitch P or integer multiple of P (e.g., 2·P, 3·P, . . . ), which is defined by the design rule for the layer to be manufactured by the photo mask. In FIG. 1A, two main patterns MP1 and MP2 (first and second from the left) are positioned with a pitch P and a third main pattern MP3 is located with a pitch 2·P from the second main pattern MP2.

FIGS. 2A and 2B show pattern layouts on a photo mask according to embodiments of the present disclosure. In FIG. 2A, which is an original layout, two main patterns MP1 and MP2 (first and second from the left) are positioned with a pitch P and a third main pattern MP3 is located with a pitch 3·P from the second main pattern MP2.

In some embodiments, the pitch P is in a range from about 40 nm to about 120 nm for DUV lithography and is in a range from about 20 nm to about 80 nm for EUV lithography. In other embodiments, the pitch P is in a range from about 50 nm to about 80 nm for DUV lithography and is in a range from about 25 nm to about 40 nm for EUV lithography. The width W1 of the main patterns MP is about 30% to about 60% of the pitch P in some embodiments, the width W1 is in a range from about 20 nm to about 600 nm for DUV lithography and is in a range from about 10 nm to about 40 nm for EUV lithography. In other embodiments, the pitch P is in a range from about 25 nm to about 40 nm for DUV lithography and is in a range from about 12 nm to about 20 nm for EUV lithography.

In the embodiment of FIG. 1B, which is a modified layout, a dummy pattern DP is inserted between the second main pattern MP2 and the third main pattern MP3, as shown in FIG. 1B. In some embodiments, the dummy pattern DP is placed so that the pitch between the second main pattern MP2 and the dummy pattern DP and the pitch between the dummy pattern DP and the third main pattern MP3 are equal to the pitch P. In other embodiments, the pitch between the second main pattern MP2 and the dummy pattern DP and/or the pitch between the dummy pattern DP and the third main pattern MP3 is not equal to the pitch P and is in a range from about 0.8×P to about 1.2×P.

In the embodiment of FIG. 2B, which is a modified layout, dummy patterns DP1 and DP2 are inserted between the second main pattern MP2 and the third main pattern MP3, as shown in FIG. 2B. In some embodiments, the dummy patterns DP1 and DP2 are placed so that the pitch between the second main pattern MP2 and the first dummy pattern DP1, the pitch between the first and second dummy patterns DP1 and DP2, and the pitch between the second dummy pattern DP2 and the third main pattern MP3 are equal to the pitch P. In other embodiments, the pitches between the main patterns and/or the dummy patterns is not equal to the pitch P and is in a range from about 0.8×P to about 1.2×P.

The width W2 of the dummy pattern DP is equal to the width W1 of the main patterns in some embodiments. In some embodiments, the width W1 is a minimum possible width allowed for the pattern to be formed by the photo mask. In other embodiments, the width W2 of the dummy patterns DP, DP1 and/or DP2 is not equal to the width W1 of the main patterns and is in a range from about 0.5×W1 to about 1.5×W1. In certain embodiments, the width of the dummy patterns is in a range from about 0.9×W1 to about 1.1×W1.

In this embodiment, the dummy pattern is a pattern that is not electrically connected to another pattern and/or is not a part of a functional circuit. In some embodiments, the dummy pattern is left in a semiconductor device as an actual pattern, and in such a case, the dummy pattern is electrically floating in the semiconductor device. In other embodiments, the dummy pattern is subsequently removed and does not exist in a semiconductor device.

By inserting a dummy pattern, the entire pattern layout becomes a simple line-and-space pattern having a constant pitch P, as shown in FIG. 1B, and thus lithography margins, such as a focus margin, can be improved. In particular, when the lithography tool has a modified illumination system, such as an annular illumination system and a quadrupole illumination system, the simple line and space patterns can increase a focus margin. In other embodiments, one or more additional dummy patterns are placed on the left of the first main pattern MP1 and/or the right of the third main pattern MP3.

Figure 3B:
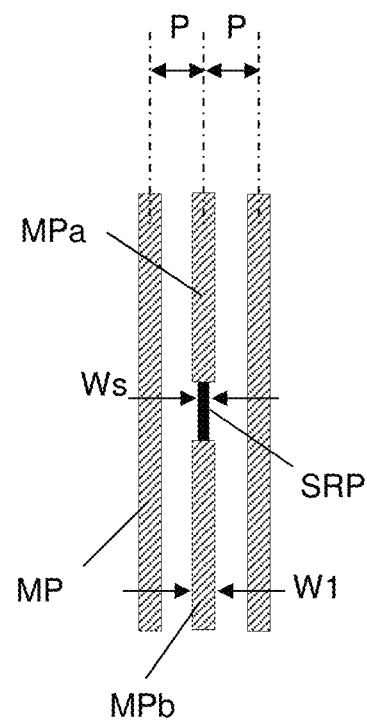

FIGS. 3A and 3B show pattern layouts on a photo mask according to embodiments of the present disclosure.

In FIG. 3A, which is an original layout, first to third main patterns MP1, MP2 and MP3 are arranged with the pitch P. The second main pattern MP2 is divided into two main patterns MPa and MPb, or the second main pattern MP2 is constituted by two main patterns MPa and MPb. A distance of the gap between the ends of the main patterns MPa and MPb is S1 as shown in FIG. 3A.

In some embodiments, a sub-resolution pattern SRP is added to the gap to connect the main patterns MPa and MPb, as shown in FIG. 3B. In some embodiments, a width Ws of the sub-resolution pattern SRP is smaller than a resolution limit of the optical lithography tool. The width Ws is smaller than the width W1 of the main patterns. In some embodiments, the width Ws of the sub-resolution pattern is in a range from about 0.1×W1 to about 0.5×W1. When a photo resist formed over a substrate is exposed by using the photo mask including a sub-resolution pattern, no actual resist pattern corresponding to the sub-resolution pattern is formed after developing the exposed resist. In some embodiments, since the sub-resolution pattern SRP is connected to the main patterns MPa and MPb, a part of the sub-resolution pattern SRP close to the main patterns MPa and MPb is resolved as a resist pattern. In such a case, however, most of the sub-resolution pattern SRP, or at least the center part of the sub-resolution pattern SRP is not resolved as a resist pattern.

When the optical lithography tool is an ArF excimer laser scanner with an immersion technology, the width Ws of the sub-resolution pattern SRP is in a range from about 8 nm to about 40 nm in some embodiments, and is in a range from about 10 nm to about 30 nm in other embodiments. When the optical lithography tool is an EUV scanner with 13.5 nm range wavelength, the width Ws of the sub-resolution pattern SRP is in a range from about 3 nm to about 16 nm in some embodiments, and is in a range from about 5 nm to about 10 nm in other embodiments.

In some embodiments, the space S1 of the gap between the main patterns MPa and MPb is equal to the minimum space Sm defined by the design rule. In certain embodiments, only when the space S1 is equal to the minimum space Sm, a sub-resolution pattern SRP is inserted between the main patterns MPa and MPb. When the optical lithography tool is an ArF excimer laser scanner with an immersion technology, the minimum space Sm is in a range from about 40 nm to about 120 nm in some embodiments, and is in a range from about 50 nm to about 100 nm in other embodiments. When the optical lithography tool is an EUV scanner with 13.5 nm range wavelength, the minimum space Sm is in a range from about 20 nm to about 80 nm in some embodiments, and is in a range from about 30 nm to about 60 nm in other embodiments.

By inserting a sub-resolution pattern SRP between the main patterns MPa and MPb, it is possible to prevent shortening of the main patterns in the lengthwise direction when formed as a resist pattern. Further, since the entire pattern layout becomes a psuedo line-and-space pattern having a constant pitch P, as shown in FIG. 3B, lithography margins, such as a focus margin, can be improved.

FIGS. 4A-4F show pattern layouts on a photo mask according to embodiments of the present disclosure. Materials, configurations, dimensions, structures, conditions and operations the same as or similar to those explained with respect to FIGS. 1A-3B may be employed in the following embodiments, and some of the explanations may be omitted. In FIGS. 4A-4F, the first and third main patterns are omitted for simplicity.

Figure 4A:
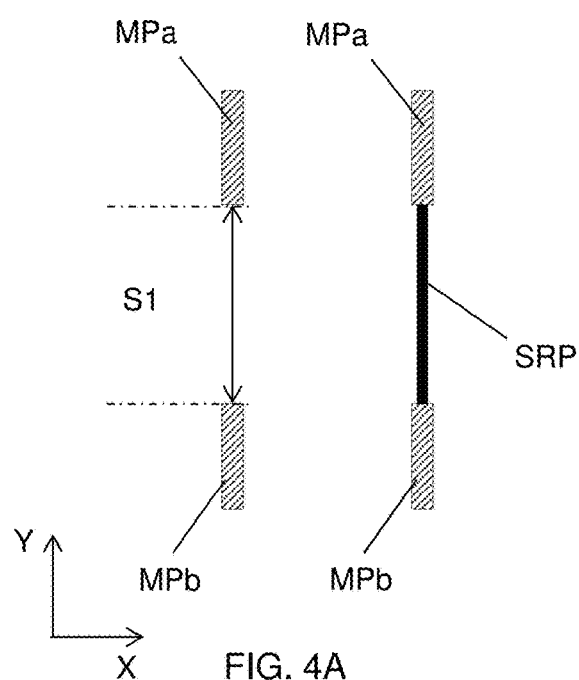
FIGS. 4A, 4B, 4C, 4D, 4E and 4F show pattern layouts on a photo mask according to embodiments of the present disclosure.

FIG. 4A shows a pattern layout on a photo mask according to an embodiment of the present disclosure. In this embodiment, for any dimension of the space S1 (distance between the ends of the main patterns MPa and MPb), a sub-resolution pattern SRP is inserted between the ends of the main patterns MPa and MPb.

Figure 4B:
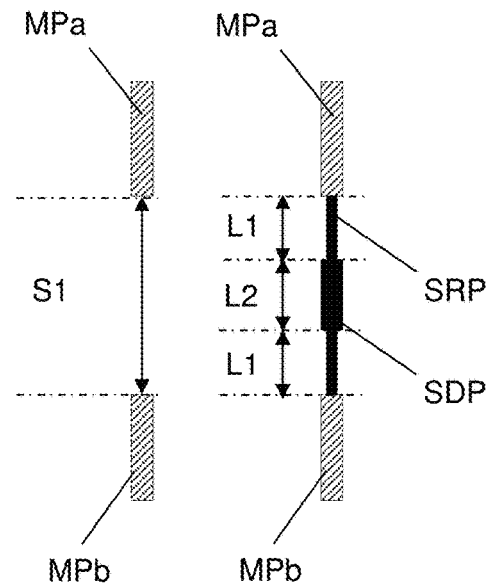
Figure 4C:
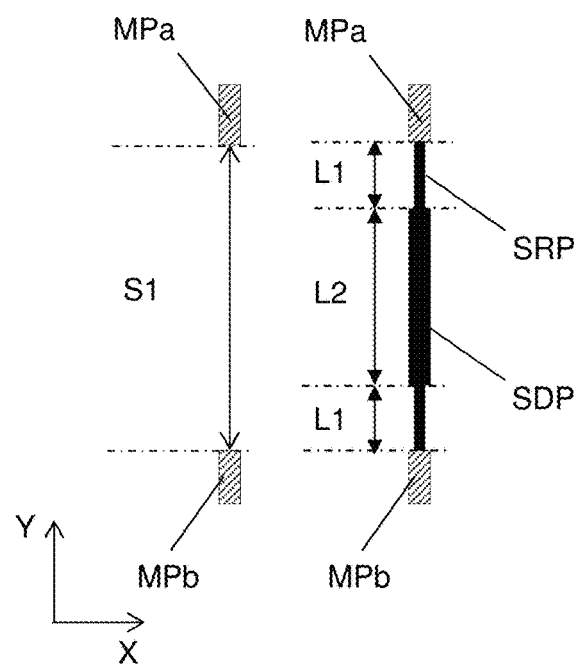
Figure 4D:
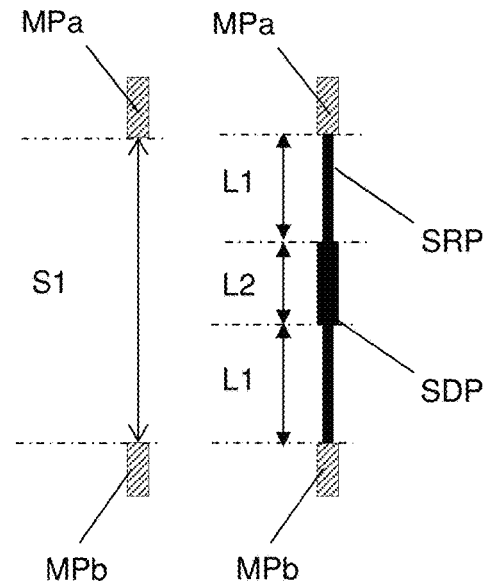

FIGS. 4B-4D show pattern layouts on a photo mask according to embodiments of the present disclosure. In this embodiment, two sub-resolution patterns SRP and one short dummy pattern SDP disposed between the two sub-resolution patterns SRP are inserted between the ends of the main patterns MPa and MPb. In some embodiments, the width of the short dummy pattern SDP is greater than the width of the sub-resolution patterns SRP, and is equal to the width W1 of the main patterns in certain embodiments. In certain embodiments, the width of the short dummy pattern SDP is in a range from about 0.9×W1 to about 1.1×W1. The lengths L1 of the sub-resolution patterns SRP are equal to each other in some embodiments, and are different from each other in other embodiments. The length L2 of the short dummy pattern SDP is equal to the length L1 of the sub-resolution patterns SRP in some embodiments, as shown in FIG. 4B, and is greater or smaller than the length L1 of the sub-resolution patterns SRP in other embodiments, as shown in FIGS. 4C and 4D.

When the optical lithography tool is an ArF excimer laser scanner with an immersion technology, the length L1 of the sub-resolution pattern SRP is in a range from about 40 nm to about 120 nm in some embodiments, and is in a range from about 50 nm to about 100 nm in other embodiments. When the optical lithography tool is an EUV scanner with 13.5 nm range wavelength, the width Ws of the sub-resolution pattern SRP is in a range from about 20 nm to about 80 nm in some embodiments, and is in a range from about 30 nm to about 60 nm in other embodiments.

In certain embodiments, the length L1 of the sub-resolution patterns SRP is equal to a predetermined amount, e.g., the minimum space Sm defined by the design rule. In some embodiments, when the space S1 is equal to or greater than 3×Sm, the combination of two sub-resolution patterns SRP and a short dummy pattern SDP is inserted between the ends of the main patterns MPa and MPb.

Figures 4E, 4F:
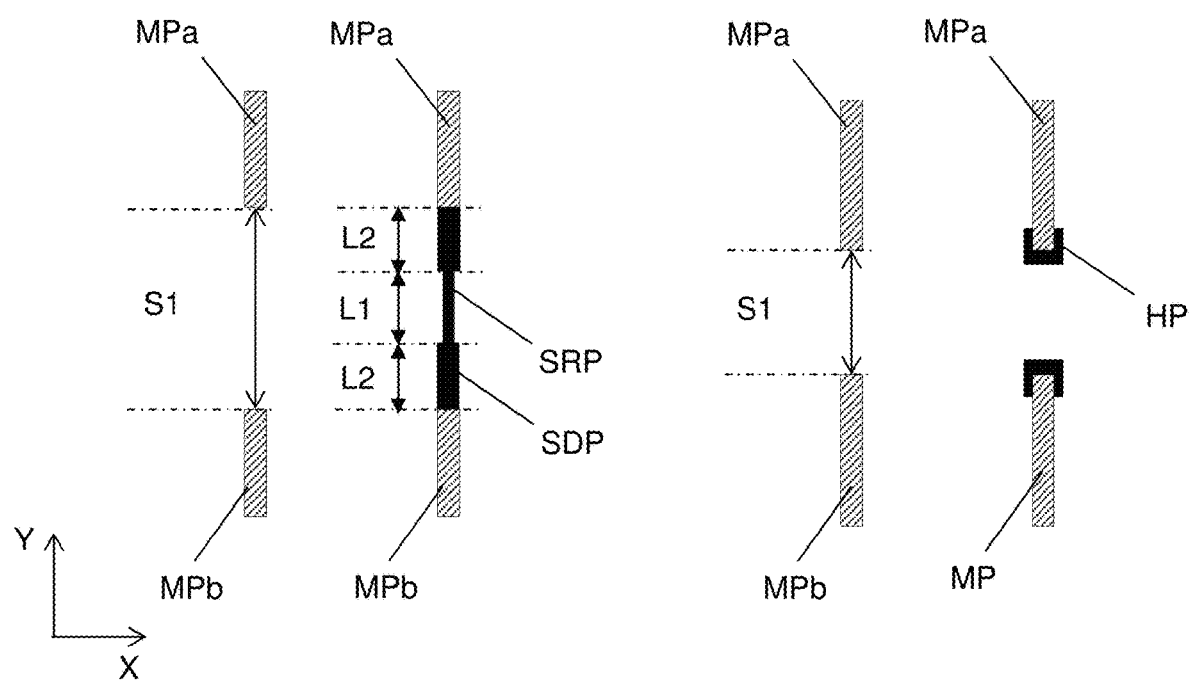

FIG. 4E shows a pattern layout on a photo mask according to an embodiment of the present disclosure. In this embodiment, two short dummy patterns SDP and one sub-resolution pattern SRP disposed between the two short dummy patterns SDP are inserted between the ends of the main patterns MPa and MPb.

By inserting a sub-resolution pattern SRP and/or a short dummy pattern SDP between the main patterns MPa and MPb, it is possible to prevent shortening of the main patterns in the lengthwise direction when formed as a resist pattern. Further, since the entire pattern layout becomes a psuedo line-and-space pattern having a constant pitch P, and thus lithography margins, such as a focus margin, can be improved.

FIG. 4F shows a pattern layout on a photo mask according to an embodiment of the present disclosure. In this embodiment, a hammer head pattern HP is added to an end of each of the main patterns MPa and MPb. By using a hammer head pattern, it is possible to prevent shortening of the main patterns in the lengthwise direction when formed as a resist pattern.

FIGS. 5A-5C show pattern layouts on a photo mask according to embodiments of the present disclosure. Materials, configurations, dimensions, structures, conditions and operations the same as or similar to those explained with respect to FIGS. 1A-4F may be employed in the following embodiments, and some of the explanations may be omitted.

FIG. 5A is the same as FIG. 3B, where the sub-resolution pattern SRP is aligned with the main patterns MPa and MPb in the lengthwise direction. In such a case, a pitch between the sub-resolution pattern SRP and the first main pattern MP1 is equal to a pitch between the sub-resolution pattern SRP and the third main pattern MP3, which is equal to the pitch P between the first, second and third patterns.

In other embodiments, the pitch P' between the sub-resolution pattern SRP and the first main pattern MP1 and/or the pitch P" between the sub-resolution pattern SRP and the third main pattern MP3 is not equal to the pitch P between the first, second and third patterns, as shown in FIGS. 5B and 5C. In some embodiments, the pitches P' and P" are in a range from about 0.70×P to about 1.30×P, and are in a range from about 0.90×P to about 1.10×P in other embodiments.

FIG. 5D shows a pattern layout on a photo mask according to embodiments of the present disclosure. Materials, configurations, dimensions, structures, conditions and operations the same as or similar to those explained with respect to FIGS. 1A-5D may be employed in the following embodiments, and some of the explanations may be omitted.

In this embodiment, at least one end of the sub-resolution pattern SRP is not connected to the main patterns MPa and MPb. In FIG. 5D, both ends of the sub-resolution pattern SRP are not connected to the main patterns MPa and MPb. The gap G1 between the sub-resolution pattern SRP and one of the main patterns MPa and MPb is in a range from about 0.5 nm to about 2.0 nm in some embodiments.

FIGS. 6A-9B show pattern layouts on a photo mask according to embodiments of the present disclosure. Materials, configurations, dimensions, structures, conditions and operations the same as or similar to those explained with respect to FIGS. 1A-5D may be employed in the following embodiments, and some of the explanations may be omitted.

Figure 6A:
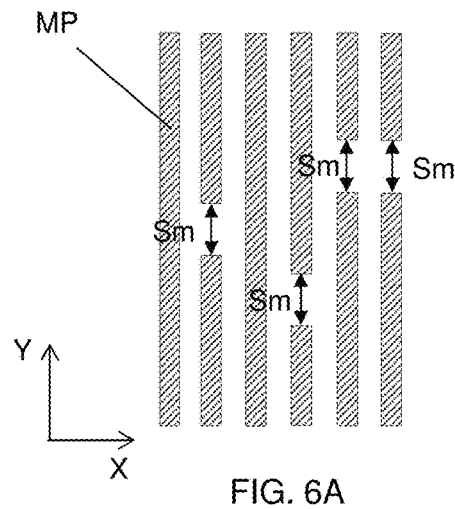
FIGS. 6A and 6B show pattern layouts on a photo mask according to an embodiment of the present disclosure.
Figure 6B:
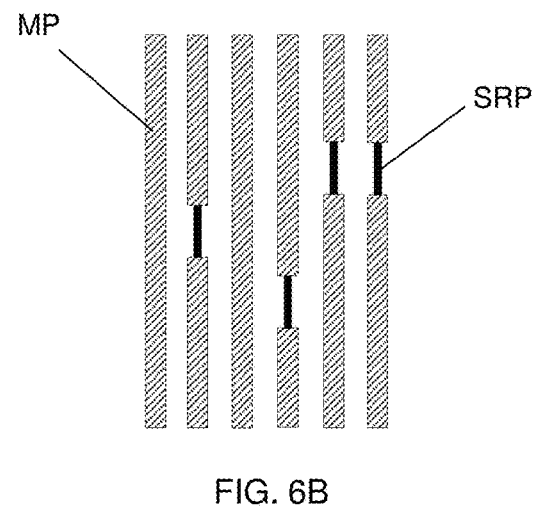

In FIG. 6A, which is an original layout, main patterns MP are arranged in the X direction with an equal pitch. Some of the main patterns MP are divided, forming a gap. In some embodiments, the length of the gap is equal to the minimum space Sm defined by the design rule. Sub-resolution patterns SRP are inserted at the respective gaps as shown in FIG. 6B. In certain embodiments, only gaps having the length of Sm according to the design rule are generated when ends of two main patterns oppose to each other. By limiting the dimension of the gap, generating sub-resolution patterns in mask design is simplified.

Figure 7A:
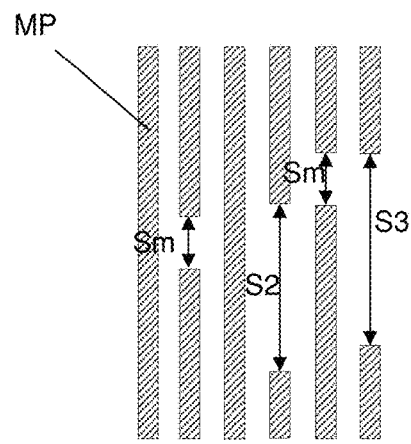
FIGS. 7A and 7B show pattern layouts on a photo mask according to an embodiment of the present disclosure.
Figure 7B:
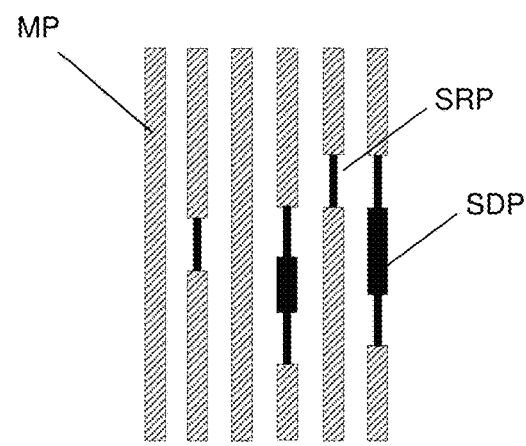

In FIG. 7A, which is an original layout, main patterns MP are arranged in the X direction with an equal pitch. Some of the main patterns MP are divided forming a gap. In some embodiments, the length of the gap is equal to the minimum space Sm defined by the design rule, or equal to or greater than 3×Sm. In FIG. 7A, one gap has a length S2 equal to 3×Sm, and one gap has a length S3 greater than 3×Sm. In certain embodiments, only gaps having the length of Sm or equal to or greater than 3×Sm provided by the design rule when ends of two main patterns oppose to each other. Sub-resolution patterns SRP are inserted at the gaps having the length Sm, and a combination of sub-resolution patterns SRP and a short dummy pattern SDP is inserted at the gaps having the length equal to or greater than 3×Sm, respectively, as shown in FIG. 7B. In some embodiments, the length of all the sub-resolution patterns SRP is equal to Sm, i.e., one size. By limiting the dimension of the gap, generating sub-resolution patterns and/or short dummy patterns SDP in mask design is simplified.

Figure 8A:
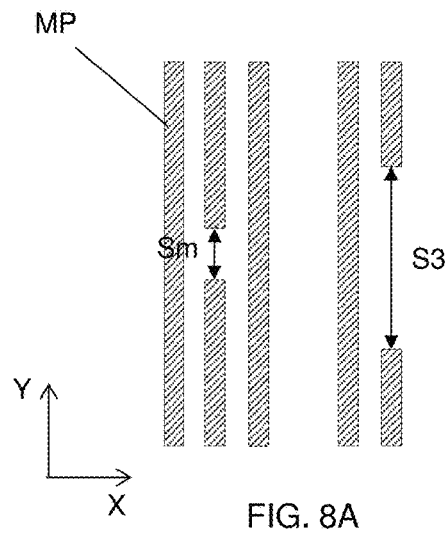
FIGS. 8A and 8B show pattern layouts on a photo mask according to an embodiment of the present disclosure.
Figure 8B:
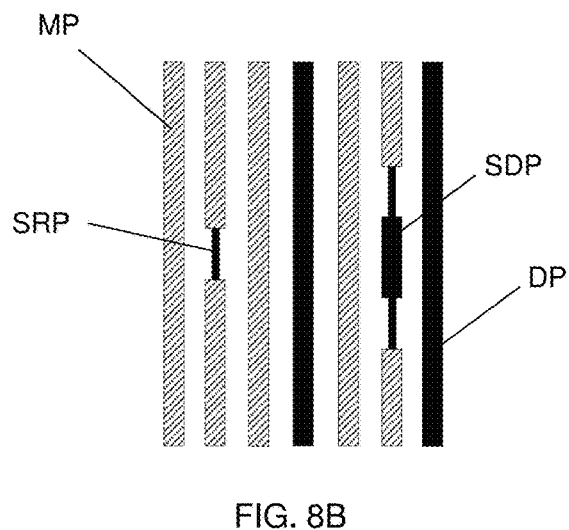

In FIG. 8A, which is an original layout, main patterns MP are arranged in the X direction. The first three main patterns MP from the left are arranged with an equal pitch, and the two main patterns from the right are arranged with an equal pitch, but the pitch P between the third and the fourth main patterns from the left is greater than the pitch P, e.g., 2×P. Some of the main patterns MP are divided forming a gap. In some embodiments, the length of the gap is equal to the minimum space Sm defined by the design rule, or equal to or greater than 3×Sm. In FIG. 8A, one gap has a length S3 greater than 3×Sm. Similar to FIG. 7B, sub-resolution patterns SRP are inserted at the gaps having the length Sm, and a combination of sub-resolution patterns SRP and a short dummy pattern SDP is inserted at the gap having the length S3 greater than 3×Sm, respectively, as shown in FIG. 8B. Further, a dummy pattern DP is inserted between the third main pattern and the fourth main pattern to make the equal pitch among the patterns. In addition, an additional dummy pattern DP is placed on the right side of the fifth main pattern, as shown in FIG. 8B.

Figure 9A:
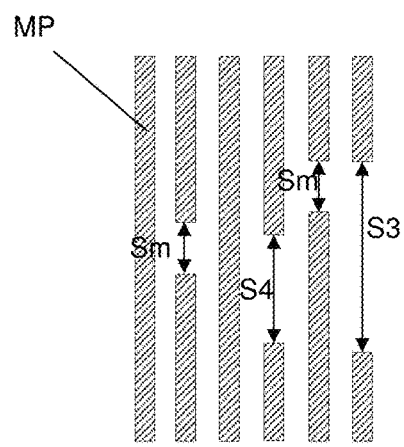
FIGS. 9A and 9B show pattern layouts on a photo mask according to an embodiment of the present disclosure.
Figure 9B:
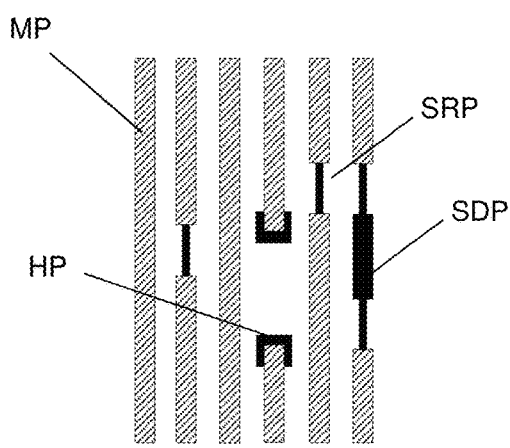

In FIG. 9A, which is an original layout, main patterns MP are arranged in the X direction with an equal pitch. Some of the main patterns MP are divided forming a gap. In some embodiments, the length of the gap is equal to the minimum space Sm defined by the design rule, equal to or greater than 3×Sm, or greater than Sm and less than 3×Sm. In FIG. 9A, one gap has a length S3 greater than 3×Sm, and one gap has a length S4 greater than Sm and less than 3×Sm. Sub-resolution patterns SRP are inserted at the gaps having the length Sm, and a combination of sub-resolution patterns SRP and a short dummy pattern SDP is inserted at the gaps having the length greater than 3×Sm, respectively, as shown in FIG. 9B. In some embodiments, hammer head patterns HP are added to ends of the main patterns forming the gap having the length S4 smaller than 3×Sm, as shown in FIG. 9B.

By inserting a sub-resolution pattern SRP and/or a short dummy pattern SDP between the main patterns MPa and MPb, it is possible to prevent shortening of the main patterns in the lengthwise direction when formed as a resist pattern. Further, since the entire pattern layout becomes a psuedo line-and-space pattern having a constant pitch P, lithography margins, such as a focus margin, can be improved. In addition, by limiting the dimension of the gap, designing the mask pattern with sub-resolution patterns and/or dummy patterns is simplified.

Figure 10:
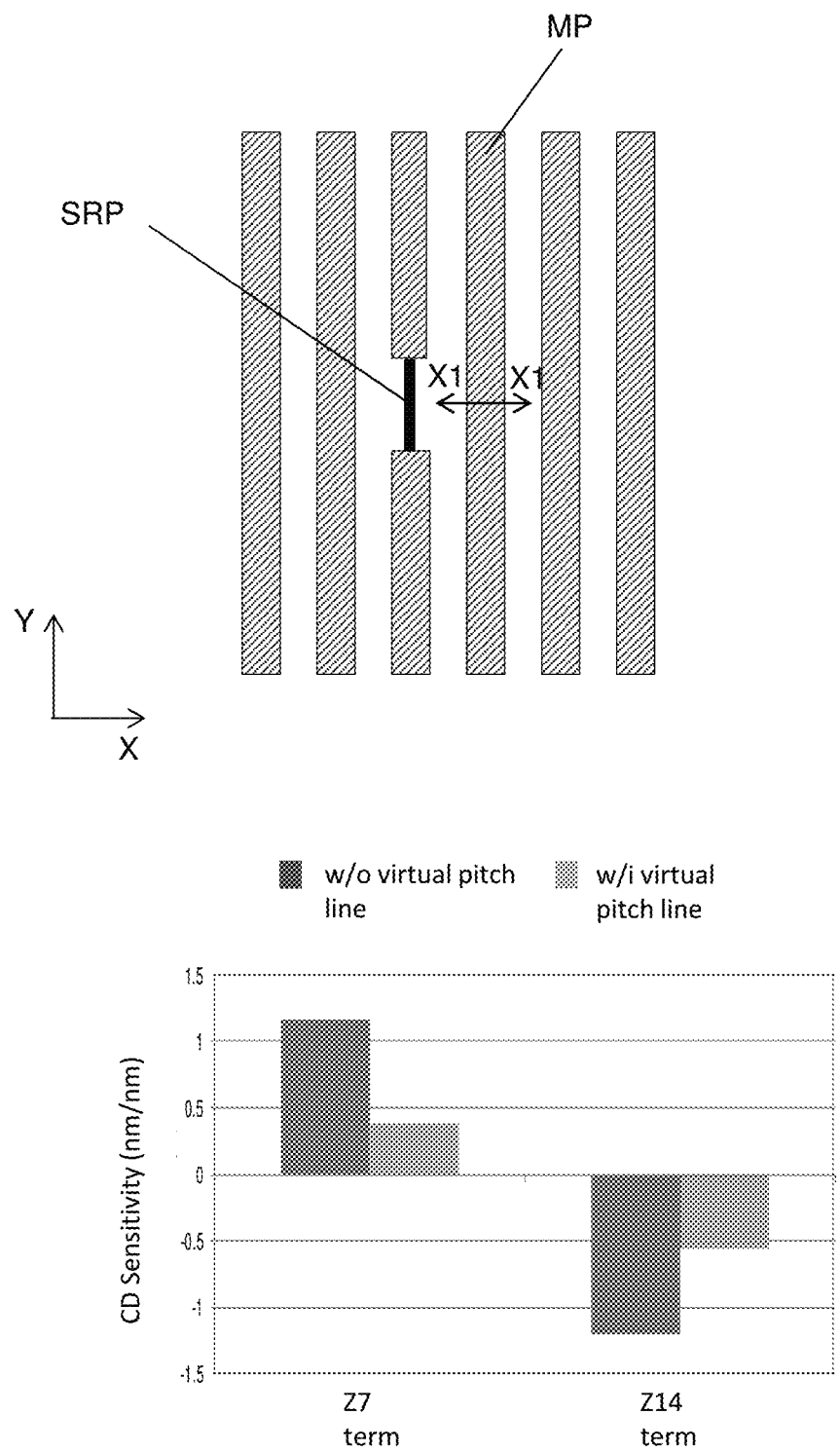
FIG. 10 shows a simulation result that illustrates the effect of the sub-resolution pattern according to an embodiment of the present disclosure.

FIG. 10 shows a simulation result that illustrates the effect of the sub-resolution pattern according to an embodiment of the present disclosure. The line width variation of the main pattern MP adjacent to the sub-resolution pattern SRP (line X1-X1) is simulated with respect to various lens aberration conditions.

When a sub-resolution pattern is not provided, the line width of the adjacent main pattern projected on a wafer by an optical lithography tool is sensitive to a lens aberration of a projection lens. In contrast, when a sub-resolution pattern SRP is provided, the line width of the adjacent main pattern MP is less sensitive to the lens aberration.

FIGS. 11A-11D show various stages of a sequential manufacturing operation of a semiconductor device according to an embodiment of the present disclosure. It is understood that additional operations can be provided before, during, and after the processes shown by FIGS. 11A-11D, and some of the operations described below can be replaced or eliminated, for additional embodiments of the method. Material, configuration, dimensions and/or processes the same as or similar to the foregoing embodiments described with FIGS. 1A-9B may be employed in the following embodiments, and detailed explanation thereof may be omitted.

In the manufacturing operation shown in FIGS. 11A-11D, conductive patterns are formed as line patterns.

Figure 11A:
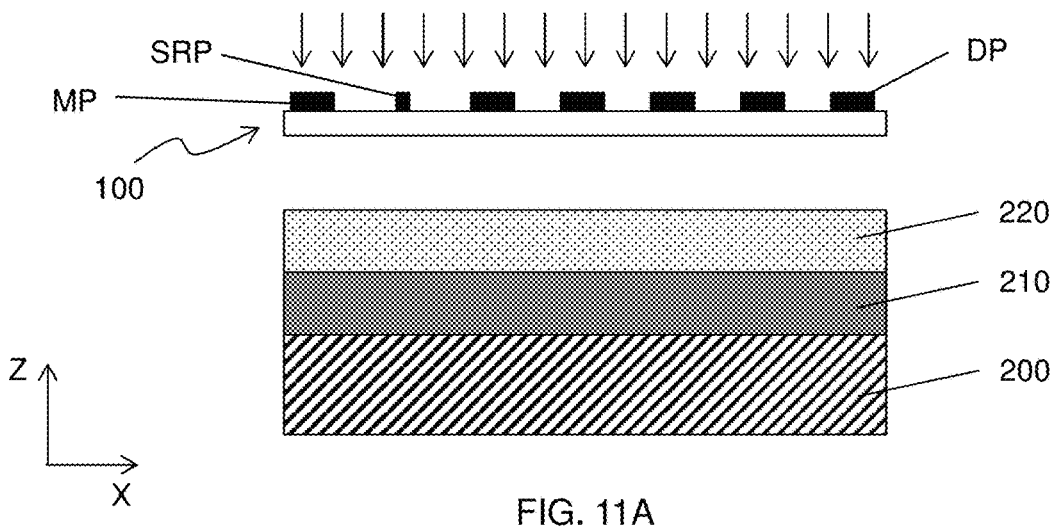
FIGS. 11A, 11B, 11C and 11D show various stages of a sequential method of manufacturing a semiconductor device according to an embodiment of the present disclosure.

As shown in FIG. 11A, a conductive layer 210 is formed over a substrate 200. In some embodiments, the substrate 200 includes a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 200 may include an epitaxial layer (epi-layer), which may be strained for performance enhancement, and/or may include a silicon-on-insulator (SOI) structure.

The conductive layer 210 includes semiconductor material such as silicon, SiGe or Ge or metallic material, such as Cu, AlCu, W, Co, Ni, Ti, TiN, Ta or TaN, or metal alloys, such as silicide. The semiconductor material can be single crystalline epitaxially formed, poly crystalline or amorphous. The conductive layer 210 can be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes, including low pressure CVD (LPCVD), ultrahigh vacuum CVD (UHVCVD), reduced pressure CVD (RPCVD), electro plating, or any combinations thereof, or any other suitable film deposition method.

Further, a photo resist layer 220 is formed over the conductive layer 210. In some embodiments, the photo resist is a positive tone photo resist. In some embodiments, a hard mask layer including one or more dielectric or metallic layers is formed on the conductive layer 210 and the photo resist layer 220 is formed on the hard mask layer.

By using a photo mask 100 designed and manufactured according to aforementioned embodiments, a photo resist is exposed with exposure light. As shown in FIG. 11A, mask patterns to be formed as a desired pattern are opaque.

Figure 11B:
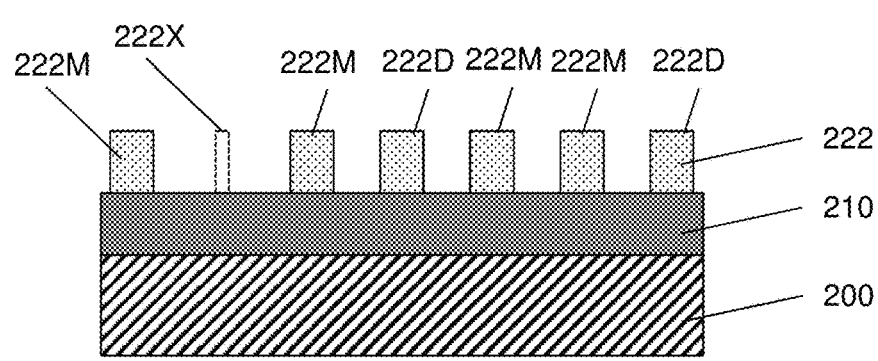

After the exposed photo resist 220 is developed, a photo resist pattern 222 is formed as shown in FIG. 11B. As shown in FIG. 11B, some of the resist patterns 222M correspond to the main patterns MP, and some of the resist patterns 222D correspond to the dummy patterns DP or the short dummy patterns. No resist pattern 222X corresponds to the sub resolution pattern SRP is formed.

Figure 11C:
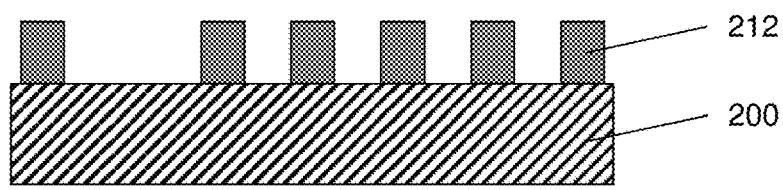
Figure 11D:
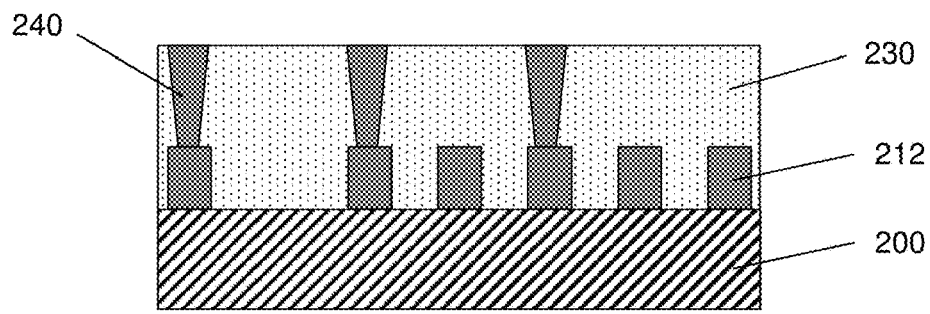

Then, as shown in FIG. 11C, the conductive layer 210 is patterned by one or more etching operations, by using the photo resist pattern 222 as an etching mask. When a hard mask layer is used, the hard mask layer is patterned by using the photo resist pattern 222 as an etching mask, and the conductive layer 210 is patterned by using the patterned hard mask layer.

Subsequently, one or more dielectric material layers 230 are formed over the patterned conductive layer 212. Further, one or more via plugs 240 are formed to contact the patterned conductive layer 212 corresponding to the main patterns, which are part of the functional circuitry. In contrast, no via plug is formed on the patterned conductive layer 212 corresponding to the dummy patterns, and thus the patterned conductive layers 212 are electrically floating in some embodiments.

FIGS. 12A-12D show various stages of a sequential manufacturing operation of a semiconductor device according to an embodiment of the present disclosure. It is understood that additional operations can be provided before, during, and after the processes shown by FIGS. 12A-12D, and some of the operations described below can be replaced or eliminated, for additional embodiments of the method. Material, configuration, dimensions and/or processes the same as or similar to the foregoing embodiments described with FIGS. 1A-11D may be employed in the following embodiments, and detailed explanation thereof may be omitted.

In the manufacturing operation shown in FIGS. 12A-12D, patterns are formed as space patterns.

Figure 12A:
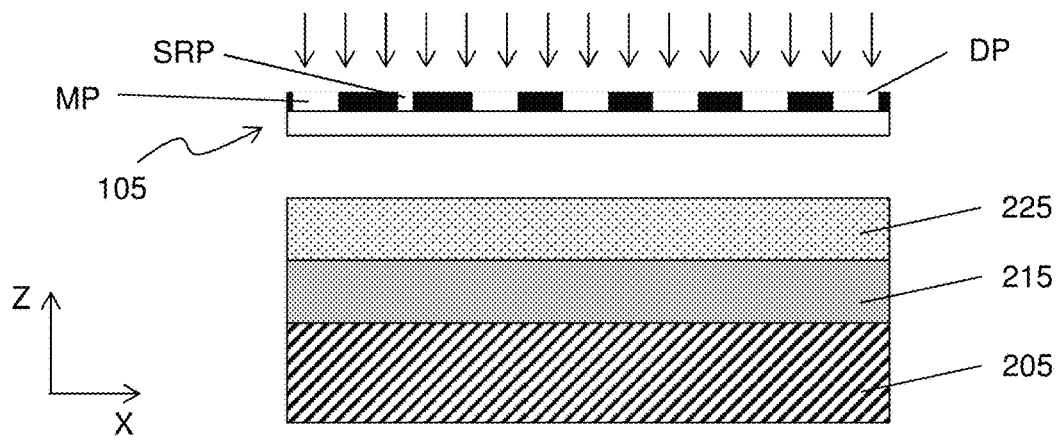
FIGS. 12A, 12B, 12C and 12D show various stages of a sequential method of manufacturing a semiconductor device according to an embodiment of the present disclosure.

As shown in FIG. 12A, a dielectric layer 215 is formed over a substrate 205, and a photo resist 225 is formed on the dielectric layer 215. In some embodiments, the photo resist is a positive tone photo resist.

In some embodiments, the dielectric layer 215 includes silicon oxide, silicon nitride, SiON, SiOC, SiOCN, SiCN, and/or organic material. The dielectric layer 215 can be formed by PVD, PLD, ALD, CVD, or any combinations thereof, or any other suitable film deposition method. In some embodiments, a hard mask layer including one or more dielectric or metallic layers is formed on the dielectric layer 215 and the photo resist layer 225 is formed on the hard mask layer.

By using a photo mask 105 designed and manufactured according to aforementioned embodiments, a photo resist is exposed with exposure light. As shown in FIG. 12A, mask patterns to be formed as a desired pattern are transparent.

Figure 12B:
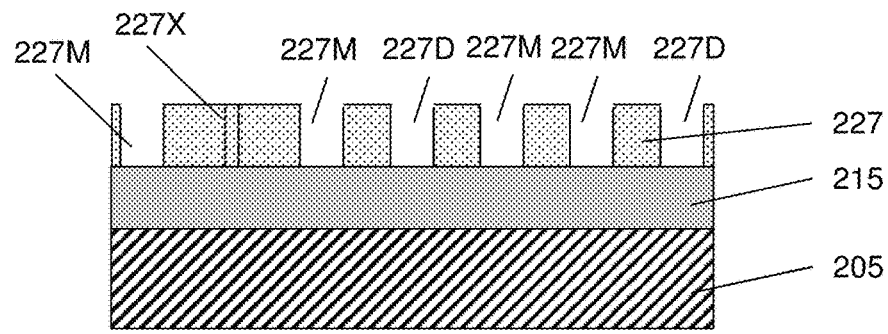

After the exposed photo resist 225 is developed, a photo resist pattern 227 is formed as shown in FIG. 12B. As shown in FIG. 12B, some of the spaces or grooves 227M formed by the resist patterns correspond to the main patterns MP, and some of the spaces or grooves 227D formed by the resist pattern correspond to the dummy patterns DP or the short dummy patterns. No space or groove 227X corresponds to the sub resolution pattern SRP is formed.

Figure 12C:
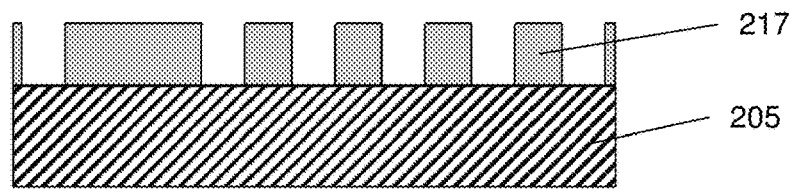
Figure 12D:
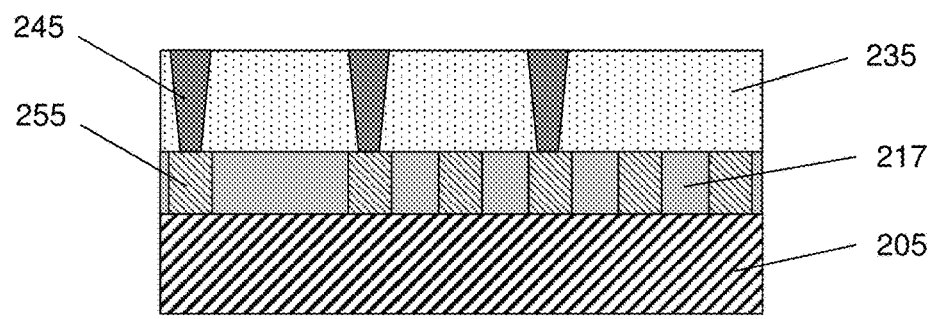

Then, as shown in FIG. 12C, the dielectric layer 215 is patterned by one or more etching operations, by using the photo resist pattern 227 as an etching mask. When a hard mask layer is used, the hard mask layer is patterned by using the photo resist pattern 227 as an etching mask, and the dielectric layer 215 is patterned by using the patterned hard mask layer.

Subsequently, conductive material layers 255 are formed in the spaces or grooves formed by the patterned dielectric layer by, for example, a damascene technique. Further, one or more dielectric material layers 235 are formed over the conductive layers 255. Further, one or more via plugs 245 are formed to contact the patterned conductive layer 255 corresponding to the main patterns, which are part of the functional circuitry. In contrast, no via plug is formed on the conductive layers 255 corresponding to the dummy patterns, and thus the conductive layers 255 are electrically floating in some embodiments.

It will be understood that not all advantages have been necessarily discussed herein, no particular advantage is required for all embodiments or examples, and other embodiments or examples may offer different advantages.

With the used of the sub-resolution patterns, short dummy patterns and/or dummy patterns, the influence of lens aberration of an optical lithography system is reduced and the process margins, such as a focus margin, are increased. Further, it is possible to reduce line-end shortage of line patterns.

According to one aspect of the disclosure, in a pattern formation method using a photo mask for manufacturing a semiconductor device, a photo resist layer is formed over a substrate. The photo resist layer is exposed with actinic radiation through the photo mask by using an optical lithography tool. The exposed photo resist layer is developed to form a resist pattern. The photo mask includes a first pattern extending in a first direction, a second pattern extending in the first direction and aligned with the first pattern, and a sub-resolution pattern extending in the first direction, disposed between an end of the first pattern and an end of the second pattern. A width of the sub-resolution pattern is smaller than a resolution limit of the optical lithography tool, and at least a center of the sub-resolution pattern is not formed as a part of the resist pattern. In one or more of the foregoing and following embodiments, a width of the first pattern and a width of the second pattern are equal to each other, and the first pattern and the second pattern are for separate circuit elements in the semiconductor device. In one or more of the foregoing and following embodiments, the sub-resolution pattern is connected to the end of the first pattern and the end of the second pattern on the photo mask. In one or more of the foregoing and following embodiments, the sub-resolution pattern is aligned with the first pattern and the second pattern in the first direction. In one or more of the foregoing and following embodiments, the sub-resolution pattern is not aligned with at least one of the first pattern and the second pattern in the first direction. In one or more of the foregoing and following embodiments, the photo mask is a transparent photo mask, and the actinic radiation is an ArF excimer laser light. In one or more of the foregoing and following embodiments, the width of the sub-resolution pattern is in a range from 8 nm to 40 nm on the substrate. In one or more of the foregoing and following embodiments, a length of the sub-resolution pattern in the first direction is in a range from 40 nm to 120 nm on the substrate. In one or more of the foregoing and following embodiments, the photo mask is a reflective photo mask, and the actinic radiation is an extreme ultra violet (EUV) light. In one or more of the foregoing and following embodiments, the width of the sub-resolution pattern is in a range from 3 nm to 16 nm on the substrate. In one or more of the foregoing and following embodiments, a length of the sub-resolution pattern in the first direction is in a range from 20 nm to 80 nm on the substrate. In one or more of the foregoing and following embodiments, the photo mask further includes a third pattern extending in the first direction and disposed on a left side of the first and second patterns, and a fourth pattern extending in the first direction and disposed on a right side of the first and second patterns. A pitch between the first and second patterns and the third pattern is equal to a pitch between the first and second patterns and the fourth pattern. In one or more of the foregoing and following embodiments, a pitch between the sub-resolution pattern and the third pattern is equal to a pitch between the sub-resolution pattern and the fourth pattern and is equal to the pitch between the first and second patterns and the third pattern. In one or more of the foregoing and following embodiments, a pitch between the sub-resolution pattern and the third pattern is not equal to the pitch between the first and second patterns and the third pattern, and is between 0.70 to 1.30 times the pitch between the first and second patterns and the third pattern. In one or more of the foregoing and following embodiments, the photo mask further includes a dummy pattern. A pitch between the dummy pattern and an adjacent active pattern is equal to the pitch between the first and second patterns and the third pattern.

In accordance with another aspect of the present disclosure, in a method of manufacturing a photo mask, original mask layout data is received. By using a computer, two patterns are found, where the two patterns are aligned in a first direction and spaced apart from each other by a gap which is sandwiched by other two patterns arranged in parallel with the two patterns in a second direction crossing the first direction. When a distance of the gap is equal to or greater than a first threshold distance and less than a second threshold distance greater than the first threshold distance, the computer inserts a sub-resolution pattern extending in the first direction and connecting the two patterns, where a width of the sub-resolution pattern is smaller than a resolution limit of an optical lithography tool, with which the photo mask is used. The computer generates new mask layout data including the sub-resolution pattern. The photo mask is manufactured according to the new mask layout data. In one or more of the foregoing and following embodiments, when the distance of the gap is equal to or greater than the second threshold distance, inserting a dummy pattern provided with two sub-resolution patterns at ends of the dummy pattern, the two sub-resolution pattern being connected to ends of the two patterns, respectively, a width of the dummy pattern is greater than the width of the sub-resolution pattern. In one or more of the foregoing and following embodiments, when the distance of the gap is smaller than the first threshold distance, no sub-resolution pattern or no dummy pattern is inserted between the two patterns. In one or more of the foregoing and following embodiments, a width of the sub-resolution pattern is between 0.1 to 0.5 times a width of the two patterns.

In accordance with another aspect of the present disclosure, in a pattern formation method using a photo mask for manufacturing a semiconductor device, a photo resist layer is formed over a substrate. The photo resist layer is exposed with actinic radiation through the photo mask by using an optical lithography tool. The exposed photo resist layer is developed to form a resist pattern. The photo mask includes a first pattern extending in a first direction, a second pattern extending in the first direction and aligned with the first pattern, a first sub-resolution pattern extending in the first direction and disposed between an end of the first pattern and an end of the second pattern, a second sub-resolution pattern extending in the first direction and disposed between an end of the first pattern and an end of the second pattern, and a first dummy pattern extending in the first direction and disposed between the first and second sub-resolution patterns. A width of the first and second sub-resolution patterns is smaller than a resolution limit of the optical lithography tool, and at least a center of the sub-resolution pattern is not formed as a part of the resist pattern. In one or more of the foregoing and following embodiments, the first dummy pattern is formed as a part of the resist pattern and is used in a subsequent etching operation as an etching mask. In one or more of the foregoing and following embodiments, a width of the first and second sub-resolution patterns is between 0.1 to 0.5 times a width of the first pattern. In one or more of the foregoing and following embodiments, a width of the first dummy pattern is between 0.9 to 1.1 times a width of the first pattern.

In accordance with another aspect of the present disclosure, a photo mask for manufacturing a semiconductor device includes a first pattern extending in a first direction, a second pattern extending in the first direction and aligned with the first pattern, and a sub-resolution pattern extending in the first direction, disposed between an end of the first pattern and an end of the second pattern. A width of the first pattern and a width of the second pattern are equal to each other, and the first pattern and the second pattern are for separate circuit elements in the semiconductor device.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method using a photo mask for manufacturing a semiconductor device, the method comprising:
   forming a photo resist layer over a substrate;
   exposing the photo resist layer with actinic radiation through the photo mask by using an optical lithography tool; and
   developing the exposed photo resist layer to form a resist pattern, wherein:
   the photo mask includes:
     a first pattern extending in a first direction;
     a second pattern extending in the first direction; and
     a sub-resolution pattern extending in the first direction, disposed between an end of the first pattern and an end of the second pattern, wherein:
   a width of the sub-resolution pattern is smaller than a resolution limit of the optical lithography tool,
   at least a part of the sub-resolution pattern is not formed as a part of the resist pattern, and
   the sub-resolution pattern is not aligned with at least one of the first pattern and the second pattern in the first direction.

2. The pattern formation method of claim 1, wherein:
   a width of the first pattern and a width of the second pattern are equal to each other, and
   the first pattern and the second pattern are for separate circuit elements in the semiconductor device.

3. The pattern formation method mask of claim 1, wherein the sub-resolution pattern is connected to the end of the first pattern and the end of the second pattern on the photo mask.

4. The pattern formation method of claim 1, wherein:
   the photo mask is a transparent photo mask; and
   the actinic radiation is an ArF excimer laser light.

5. The pattern formation method of claim 4, wherein the width of the sub-resolution pattern is in a range from 8 nm to 40 nm on the substrate.

6. The pattern formation method of claim 4, wherein a length of the sub-resolution pattern in the first direction is in a range from 40 nm to 120 nm on the substrate.

7. The pattern formation method of claim 1, wherein:
the photo mask is a reflective photo mask; and
the actinic radiation is extreme ultra violet (EUV) light.

8. The pattern formation method of claim 7, wherein the width of the sub-resolution pattern is in a range from 3 nm to 16 nm on the substrate.

9. The pattern formation method of claim 7, wherein a length of the sub-resolution pattern in the first direction is in a range from 20 nm to 80 nm on the substrate.

10. A pattern formation method using a photo mask for manufacturing a semiconductor device, the method comprising:
forming a photo resist layer over a substrate;
exposing the photo resist layer with actinic radiation through the photo mask by using an optical lithography tool; and
developing the exposed photo resist layer to form a resist pattern, wherein:
the photo mask includes:
a first pattern extending in a first direction;
a second pattern extending in the first direction;
a sub-resolution pattern extending in the first direction and disposed between an end of the first pattern and an end of the second pattern;
a third pattern extending in the first direction and disposed on a left side of the first and second patterns;
a fourth pattern extending in the first direction and disposed on a right side of the first and second patterns; and
a dummy pattern, wherein:
a width of the sub-resolution pattern is smaller than a resolution limit of the optical lithography tool,
a pitch between the first and second patterns and the third pattern is equal to a pitch between the first and second patterns and the fourth pattern, and
a pitch between the dummy pattern and an adjacent active pattern is equal to the pitch between the first and second patterns and the third pattern.

11. The pattern formation method of claim 10, wherein a pitch between the sub-resolution pattern and the third pattern is equal to a pitch between the sub-resolution pattern and the fourth pattern and is equal to the pitch between the first and second patterns and the third pattern.

12. The pattern formation method of claim 10, wherein a pitch between the sub-resolution pattern and the third pattern is not equal to the pitch between the first and second patterns and the third pattern.

13. The pattern formation method of claim 12, wherein the pitch between the sub-resolution pattern and the third pattern is between 0.70 to 1.30 times the pitch between the first and second patterns and the third pattern.

14. The pattern formation method of claim 10, wherein the dummy pattern is formed as a part of the resist pattern and is used in a subsequent etching operation as an etching mask.

15. The pattern formation method of claim 10, wherein a width of the sub-resolution pattern is between 0.1 to 0.5 times a width of the first pattern.

16. The pattern formation method of claim 10, wherein a width of the dummy pattern is equal to a width of the first pattern.

17. A pattern formation method using a photo mask for manufacturing a semiconductor device, the method comprising:
forming a photo resist layer over a substrate;
exposing the photo resist layer with an actinic radiation through the photo mask by using an optical lithography tool; and
developing the exposed photo resist layer to form a resist pattern, wherein:
the photo mask includes:
a first pattern extending in a first direction;
a second pattern extending in the first direction and aligned with the first pattern;
a first sub-resolution pattern extending in the first direction and disposed between an end of the first pattern and an end of the second pattern;
a second sub-resolution pattern extending in the first direction and disposed between an end of the first pattern and an end of the second pattern; and
a dummy pattern extending in the first direction and disposed between the first and second sub-resolution patterns, wherein:
a width of the first and second sub-resolution patterns is smaller than a resolution limit of the optical lithography tool, and
at least a part of the sub-resolution pattern is not formed as a part of the resist pattern.

18. The pattern formation method of claim 17, wherein the dummy pattern is formed as a part of the resist pattern and is used in a subsequent etching operation as an etching mask.

19. The pattern formation method of claim 17, wherein a width of the first and second sub-resolution patterns is between 0.1 to 0.5 times a width of the first pattern.

20. The pattern formation method of claim 17, wherein a width of the dummy pattern is between 0.9 to 1.1 times a width of the first pattern.

* * * * *